United States Patent
Renavikar et al.

(10) Patent No.: US 7,087,521 B2
(45) Date of Patent: Aug. 8, 2006

(54) FORMING AN INTERMEDIATE LAYER IN INTERCONNECT JOINTS AND STRUCTURES FORMED THEREBY

(75) Inventors: Mukul P. Renavikar, Chandler, AZ (US); John P. Barnak, Newberg, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/993,609

(22) Filed: Nov. 19, 2004

(65) Prior Publication Data

US 2006/0110916 A1    May 25, 2006

(51) Int. Cl.
  *H01L 21/44*    (2006.01)
(52) U.S. Cl. .................. 438/652; 438/612; 438/614
(58) Field of Classification Search ............... 438/652, 438/612, 614, 653
  See application file for complete search history.

(56) References Cited

U.S. PATENT DOCUMENTS

| | | | | |
|---|---|---|---|---|
| 5,629,564 A | * | 5/1997 | Nye et al. .................. 257/762 |
| 5,747,361 A | * | 5/1998 | Ouellet ........................ 438/643 |
| 6,204,179 B1 | * | 3/2001 | McTeer ....................... 438/687 |
| 2001/0045661 A1 | * | 11/2001 | Yang et al. .................. 257/763 |
| 2004/0063310 A1 | * | 4/2004 | Ngo et al. ................... 438/637 |
| 2004/0180535 A1 | * | 9/2004 | Elliott et al. ................ 438/629 |
| 2005/0212133 A1 | | 9/2005 | Barnak et al. | |

OTHER PUBLICATIONS

R.C. Ellwanger, et al. "An integrated aluminum/CVD-W metallization process for sub-micron contact filling". 1991 Proc. 8th International IEEE VLSI Multilevel Interconnection Conf. Jun. 11-12, 1991, Santa Clara, CA. pp. 41-50.*

* cited by examiner

*Primary Examiner*—Caridad Everhart
(74) *Attorney, Agent, or Firm*—Kathy J. Ortiz

(57) ABSTRACT

Methods of forming a microelectronic structure are described. Those methods include forming a first adhesion layer on a conductive layer, forming an intermediate layer on the first adhesion layer, and forming a barrier layer on the intermediate layer, wherein the intermediate layer includes a coefficient of thermal expansion that is approximately between the coefficient of thermal expansion of the first adhesion layer and the coefficient of thermal expansion of the barrier layer.

36 Claims, 8 Drawing Sheets

FORMING AN INTERMEDIATE LAYER IN INTERCONNECT JOINTS AND STRUCTURES FORMED THEREBY

BACKGROUND OF THE INVENTION

As semiconductor technology advances for higher processor performance, package sizes may shrink and higher input/output (I/O) counts may be required to reduce manufacturing costs. Packaging technologies, especially in some chipset applications, may drive a finer pitch between interconnect structures, such as between solder balls in a ball grid array package. With the scaling of pitch, smaller ball size is expected which may pose a challenge to interconnect joint (i.e., the interface between an interconnect structure and another surface, such as a substrate or contact pad) performance.

Interconnect joint failures have been observed in many types of packaging assemblies, such as in ball grid array assemblies. These failures may be due to various stresses, such as thermal or physical stresses that may be incurred after a reflow process has been performed on the interconnect structure, for example.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
FIGS. 1a–1h represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic device, such as a joint structure, are described. Those methods may comprise forming a first adhesion layer on a conductive layer, forming an intermediate layer on the first adhesion layer, and then forming a barrier layer on the intermediate layer. The intermediate layer may comprise a coefficient of thermal expansion that is approximately between the coefficient of thermal expansion of the first adhesion layer and the coefficient of thermal expansion of the barrier layer, such that the intermediate layer may serve to reduce the stress between the first adhesion layer and the barrier layer. A second adhesion layer may then be formed on the barrier layer, and a joint forming layer may be formed on the second adhesion layer.

FIGS. 1a–1h illustrate an embodiment of a method of forming a microelectronic structure, such as a joint structure, for example. FIG. 1a illustrates a conductive layer 100. The conductive layer 100 may be comprised of any type of conductive material as are well known in the art, such as copper, for example. The conductive layer 100 may comprise a portion of a microelectronic device, such as a conductive bond pad on a chip (not shown).

Figure 1B:
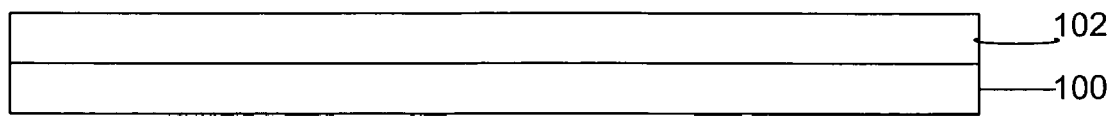
Figure 1C:
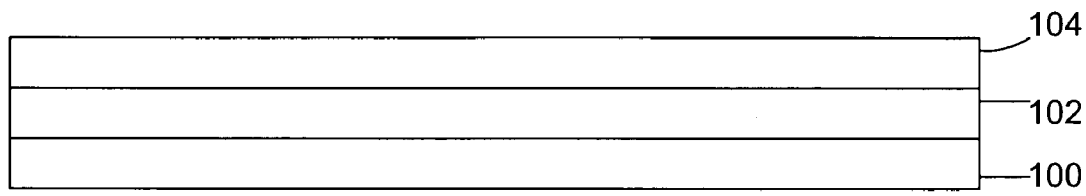

A first adhesion layer 102 may be formed on the conductive layer 100 (FIG. 1b). In one embodiment, the first adhesion layer 102 may comprise any such material, such as but not limited to titanium, chromium, titanium tungsten, copper, and combinations thereof, for example, that may provide adhesion between the conductive layer 100 and a subsequently formed intermediate layer 104 (FIG. 1c). The first adhesion layer 102 may comprise a coefficient of thermal expansion that may be dependent upon the material composition of the first adhesion layer 102. In one embodiment, the coefficient of thermal expansion may comprise about 8 ppm when the first adhesion layer 102 comprises titanium, for example. The first adhesion layer 102 may be formed utilizing any of the methods of forming such adhesion films known in the art, such as but not limited to physical vapor deposition. In one embodiment, the first adhesion layer 102 may comprise a thickness in a range of about 500 angstroms to about 1500 angstroms.

Figure 1D:
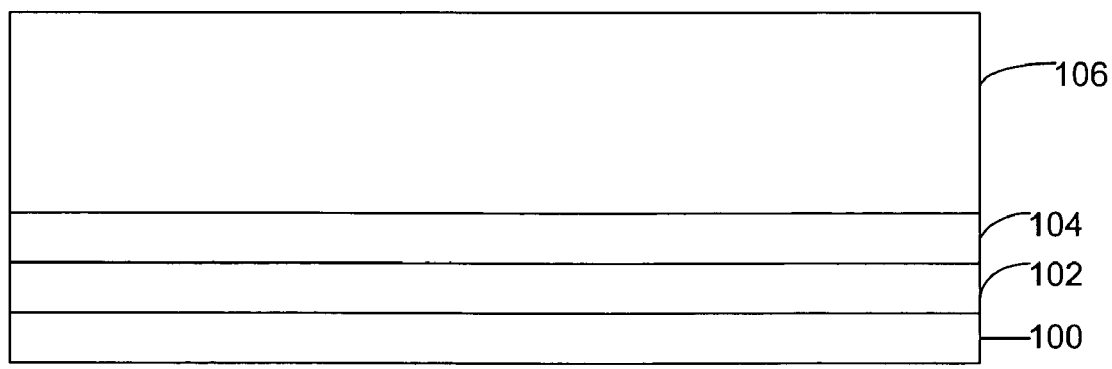
Figure 1E:
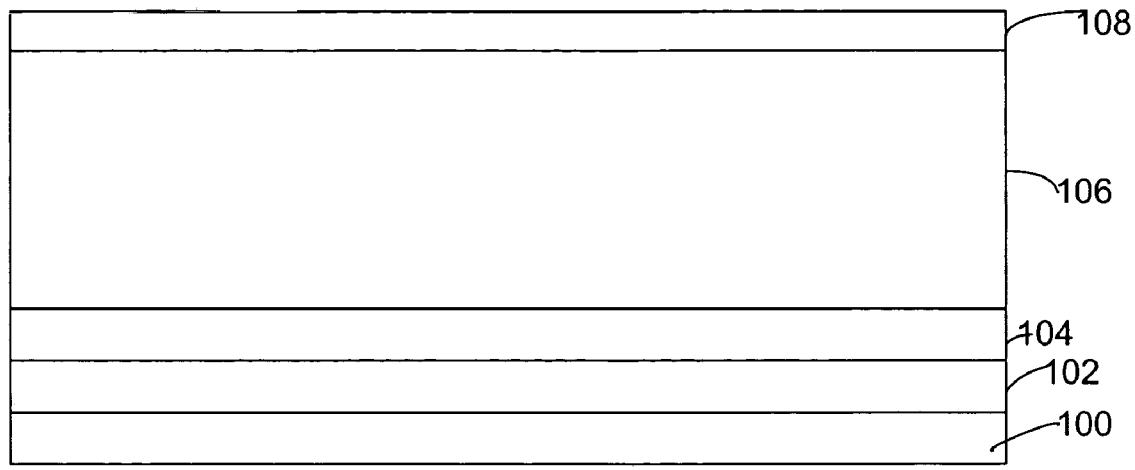

The intermediate layer 104 may be formed on the first adhesion layer layer 102 (FIG. 1c). The intermediate layer 104 may comprise any such material that has a coefficient of thermal expansion that is between the coefficient of thermal expansion of the first adhesion layer 102 and a coefficient of thermal expansion of a subsequently formed barrier layer 106 (FIG. 1d). In one embodiment, the intermediate layer 104 may comprise nickel vanadium, and may comprise a coefficient of thermal expansion of about 14 ppm. In another embodiment, the intermediate layer 104 may comprise silver (19 ppm) and/or palladium (12 ppm). The intermediate layer 104 may be formed utilizing any of the methods known in the art for forming such films, such as, but not limited to, physical vapor deposition. In one embodiment, the intermediate layer 104 may comprise a thickness below about 1,000 angstroms, and in another embodiment, the intermediate layer 104 may comprise a thickness below about 500 angstroms.

The barrier layer 106 may comprise any such material that may serve to prevent diffusion of various materials into the conductive layer 100, such as, but not limited to, lead or tin, which may be present in subsequently formed interconnect structures, such as, but not limited to, solder balls from a ball grid array process for example, as are well known in the art. The barrier layer 106 may be formed by any method known in the art to form barrier layers, such as but not limited to physical vapor deposition, for example. In one embodiment, the barrier layer 106 may comprise aluminum, and may comprise a coefficient of thermal expansion of about 23 ppm, the first adhesion layer 102 may comprise titanium, and may comprise a coefficient of thermal expansion of about 8 ppm, and the intermediate layer 104 may comprise nickel vanadium, and may comprise a coefficient of thermal expansion of about 14 ppm. In one embodiment, the barrier layer 106 may comprise a thickness in a range from about 0.8 microns to about 1.2 microns.

The intermediate layer 104 may be chosen to have a coefficient of thermal expansion such that its magnitude lies between that of the barrier layer 106 and the first adhesion layer 102, so that the magnitude of the stress 112 of the first adhesion layer 102 and the magnitude of the stress 114 (FIG. 1f) of the barrier layer 106 may be significantly reduced as compared with joint structures that do not utilize the stress reducing intermediate layer 104.

For example, in one embodiment, the first adhesion layer 102 may comprise titanium, which may be in a tensile state of stress as formed, and the barrier layer 106 may comprise aluminum, which may be in a compressive state of stress as formed. Forming the intermediate layer 104 between the first adhesion layer 102 and the barrier layer 106 may significantly reduce the magnitude of stresses in the barrier layer 106 and the first adhesion layer 102.

Figure 5A:
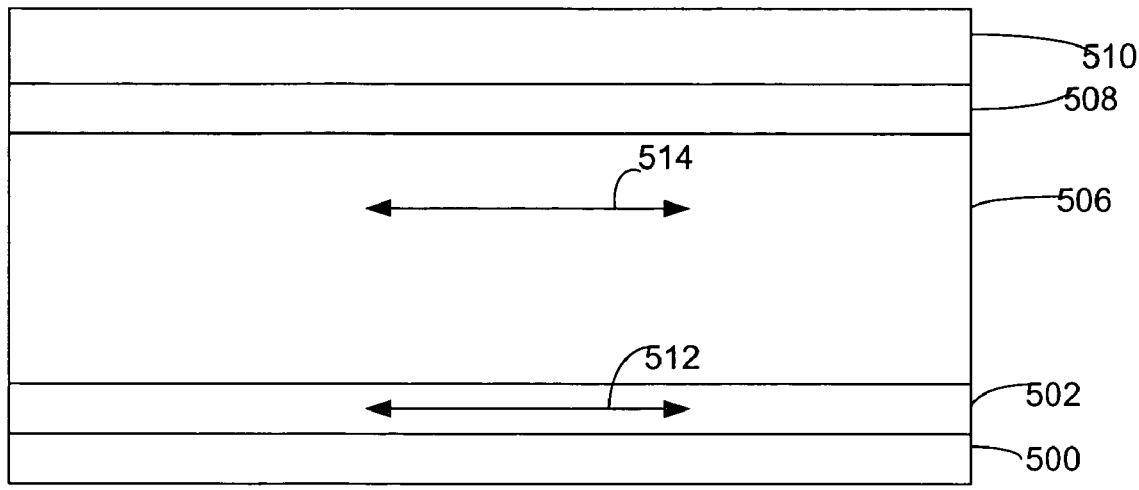
FIGS. 5a–5b represent a structure according the Prior Art.

Since the intermediate layer 104 may comprises a coefficient of thermal expansion (15 ppm for nickel vanadium in this embodiment) between that of the first adhesion layer 102 (8 ppm for titanium in this embodiment) and the barrier layer 106 (23 ppm for aluminum in this embodiment), the intermediate layer 104 may serve to compensate, or cancel out, the stresses of the barrier layer 106 and the first adhesion layer 102. Thus, joint structures that do not utilize such an intermediate layer 104 may exhibit much larger stress values. For example, an adhesion layer 502 and a barrier layer 506 may exhibit much larger magnitudes of stress 512, 514, respectively (FIG. 5a, PriorArt), than the magnitudes of stress 112, 114 in the joint structure 111 of FIG. 1f.

Figure 1F:
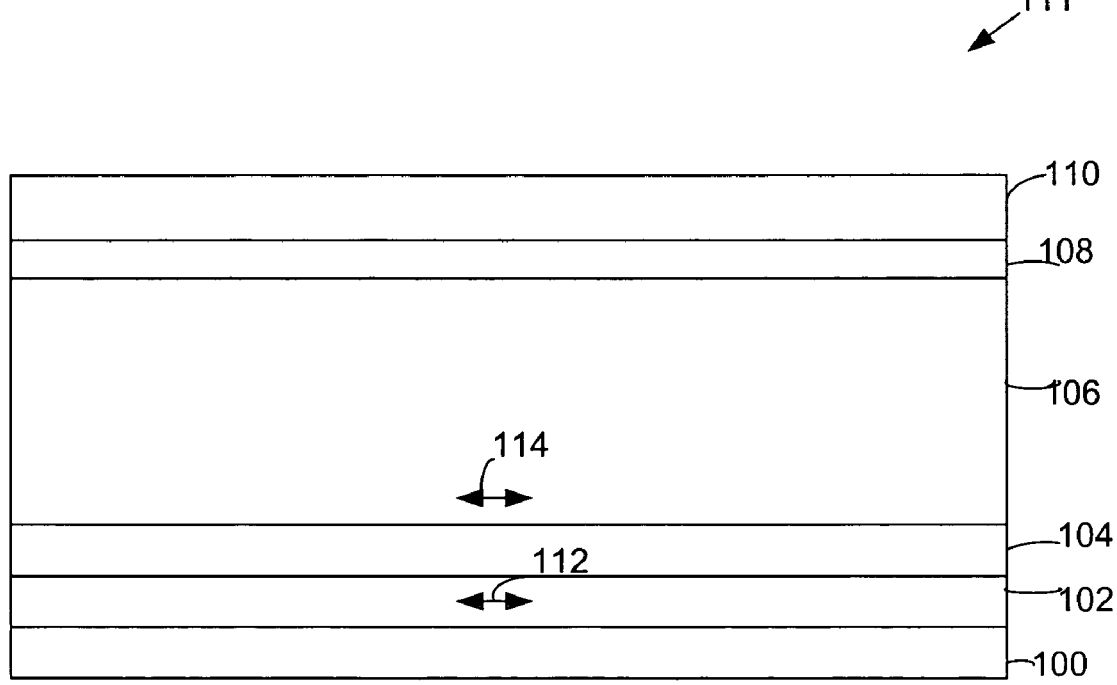

Returning back to FIG. 1e, a second adhesion layer 108, similar to the first adhesion layer 102, may be formed on the barrier layer 106, utilizing formation methods known in the art. in one embodiment, the second adhesion layer 108 may comprise titanium, for example. In one embodiment, the second adhesion layer 108 may comprise a thickness in a range of about 500 angstroms to about 1500 angstroms. A joint forming structure 110 may be formed on the second adhesion layer 108 (FIG. 1f). The joint forming layer 110 may comprise any such material that serves to form a joint, or connection, to a subsequently formed interconnect structure, such as but not limited to a solder ball, as is well known in the art. In one embodiment, the joint forming layer 110 may comprise nitrided nickel vanadium, as is well known in the art. In other embodiments, the joint forming layer 110 may comprise copper and/or chrome and combinations thereof, as well as nickel-chrome alloys, and may be formed utilizing any of the known formation methods known in the art, such as but not limited to physical vapor deposition. In one embodiment, the joint forming 110 layer may comprise a thickness in a range from about 3600 to about 4400 angstroms.

Figure 5B:
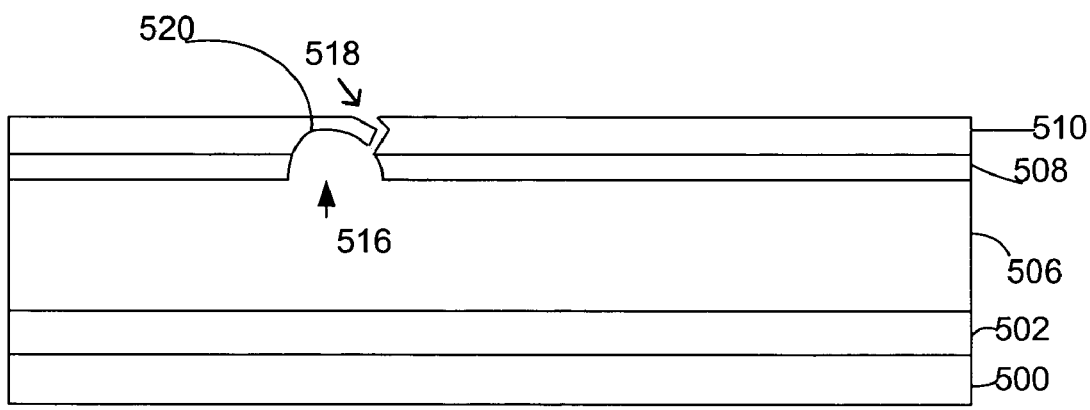

By utilizing the intermediate layer 104, stress induced migration of the atoms of the barrier layer 106, which in one embodiment may comprise aluminum, for example, may be substantially reduced and/or eliminated. For example, referring to FIG. 5b, in prior art joint structures (i.e., those joint structures that do not comprise the intermediate layer 104 between the first adhesion layer 102 and the barrier layer 106 as in FIG. 1f, for example) barrier layer 506 atoms may diffuse along the barrier layer 506 grain boundaries (not shown), as is well known in the art, and may form hillocks 516, or clumps of barrier layer 106 atoms, that may protrude through a second adhesion layer 508 (FIG. 5b). The hillocks 516 may further protrude into the joint forming layer 110 and/or cause propagation of stress into the joint forming layer 110. This protrusion and/or stress propagation may cause defects, such as cracks 518 and/or grooves 520, in the joint forming layer 510.

The presence of the stress reducing intermediate layer 104 between the first adhesion layer 102 and the barrier layer 106 of the joint structure 111 of FIG. 1f for example may prevent the formation of hillocks and subsequent barrier layer 106 atom diffusion through the barrier layer 106, through the second adhesion layer 108 and through the joint forming layer 110 (FIG. 1f). Thus, the joint forming layer 110 in one embodiment may be substantially free of defects, such as the cracks 518 and/or grooves 520 which may be found in prior art joint structures (FIG. 5b), due to the lack of the utilization of the intermediate layer 104. In one embodiment, the number of defects, such as hillocks per square area, (such as but not limited a square micron), may be reduced from about 120 to about 150 per square micron (prior art) to about 30 to about 40 per square micron with the use of the intermediate layer 104. In general the use of the intermediate layer 104 may result in a reduction in defects of at least about 70 percent of those present in prior art structures.

Figure 1G:
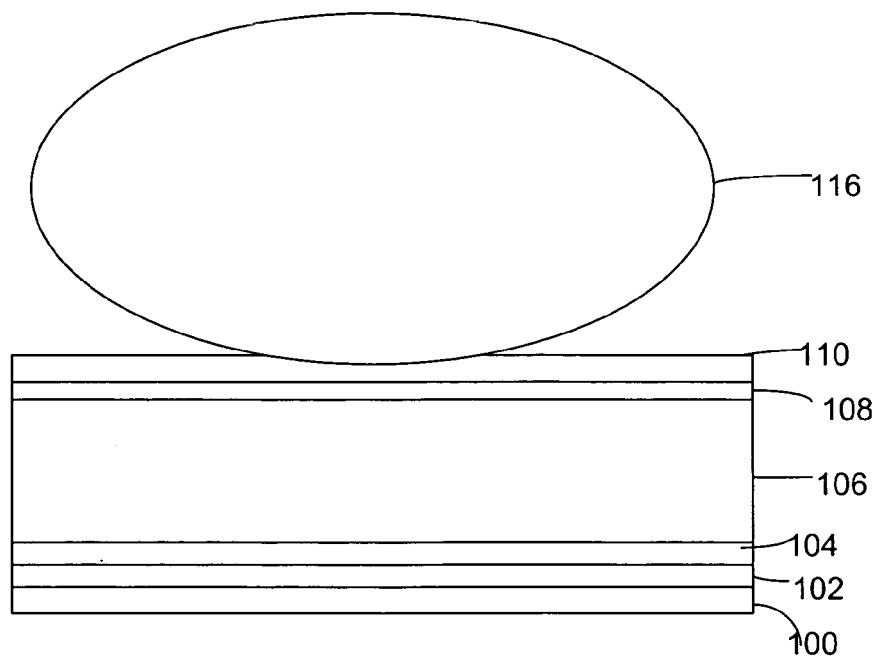

An interconnect structure 116 may be formed on the joint forming layer 110 (FIG. 1g). In one embodiment, the interconnect structure 116 may comprise a solder ball, as is well known in the art. In another embodiment, the interconnect structure 116 may comprise a portion of an array of interconnect structures (not shown), such as a ball grid array. In another embodiment, the interconnect structure 116 may comprise a lead tin solder ball.

The presence of the intermediate layer 104 between the first adhesion layer 102 and the barrier layer 106 may prevent the diffusion of materials from the interconnect structure 116, such as but not limited to lead and tin, through cracks in the joint forming layer 110 that would likely occur in the absence of the intermediate layer 104. This diffusion may result in deleterious brittle intermetallic formation within and/or on the joint structure 111, as is well known in the art. Such brittle intermetallics may be points of structural weakness within the joint structure 111 and/or between the interconnect structure 116 and the joint forming layer 110. Thus, delamination of the interconnect structure 116 that may be caused by interconnect structure 116 material diffusion within and/or on the joint structure 111, may be greatly reduced and/or eliminated, thereby greatly improving interconnect joint reliability.

Figure 1H:
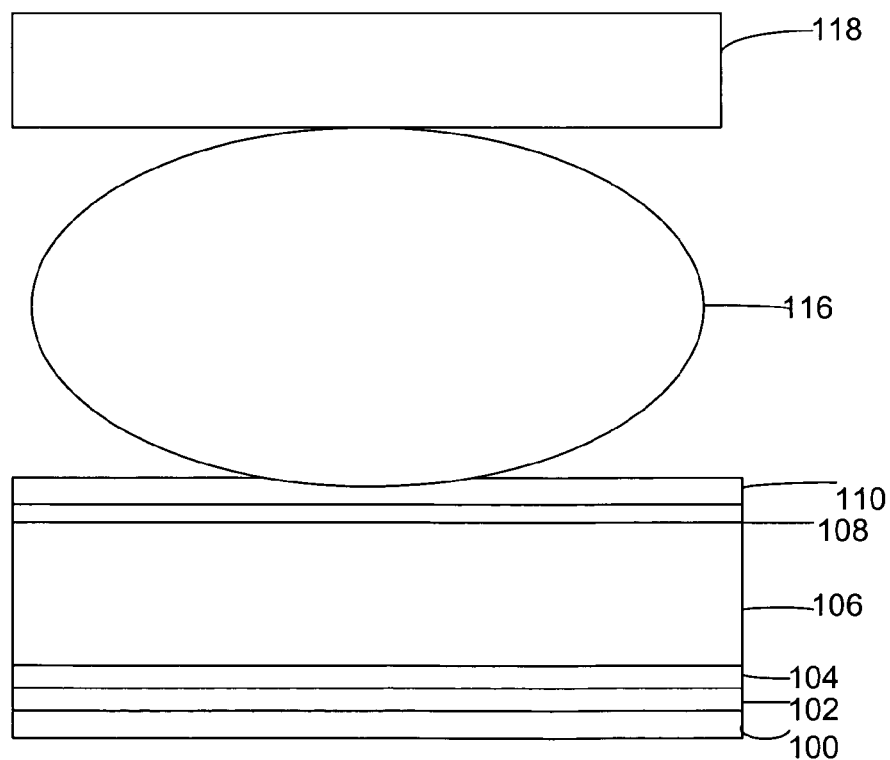

A substrate 118 may be attached according to methods well known in the art, to the interconnect structure 116 (FIG. 1h). The substrate may comprise, by illustration and not limitation, a land grid array socket, an interposer, a motherboard, and a test coupon.

Figure 2A:
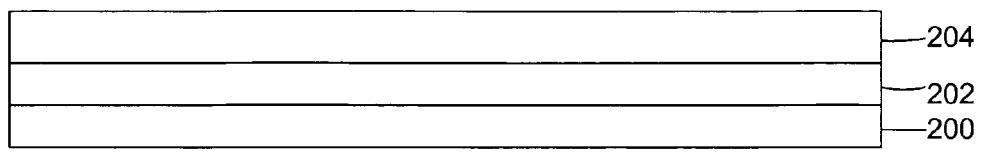
FIGS. 2a–2b represents methods of forming structures according to another embodiment of the present invention.
Figure 2B:
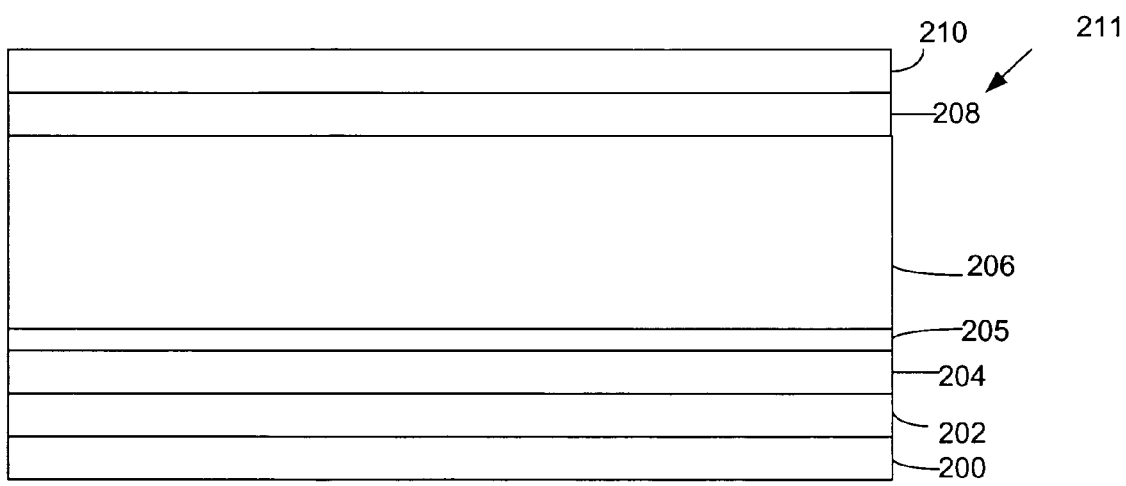

In another embodiment, an intermediate layer 204 may be disposed on a first adhesion layer 202 which may be disposed on a conductive layer 200 (FIG. 2a), similar to the intermediate layer 104, first adhesion layer 102 and conductive layer 100 of FIG. 1f, for example. Upon formation of a barrier layer 206 on the intermediate layer 204, an intermetallic layer 205 may be formed between the intermediate layer 204 and the barrier layer 206 (FIG. 2b). The intermetallic layer 205 may comprise a composite of the materials from the intermediate layer 204 and the barrier layer 206. In one embodiment, the intermetallic layer 205 may comprise nickel vanadium aluminum, silver, titanium, palladium and combinations thereof.

In one embodiment, the intermediate layer 204 may comprise nickel vanadium, the barrier layer 206 may comprise aluminum, and the intermetallic layer 205 may comprise nickel$_3$ aluminum. The intermetallic layer 205 may be formed according to methods known in the art, such as physical vapor deposition. The composition of the intermetallic layer 205 may be determined according to the composition of the barrier layer 206 and the intermediate layer 204, and may depend upon the temperature and process conditions during formation of the barrier layer 206 on the intermediate layer 204. In one embodiment, the barrier layer 206 may comprise aluminum, and may be formed on the intermediate layer 204 at a temperature from about 200 to about 300 degrees Celsius. The intermetallic layer 205 may prevent the diffusion of barrier layer 206 atoms through the barrier layer 206, thus preventing hillocks and other defects, such as grooves and/or cracks, in the barrier layer 206 a subsequently formed second adhesion layer 208 and/or a joint forming layer 210.

Figure 3:
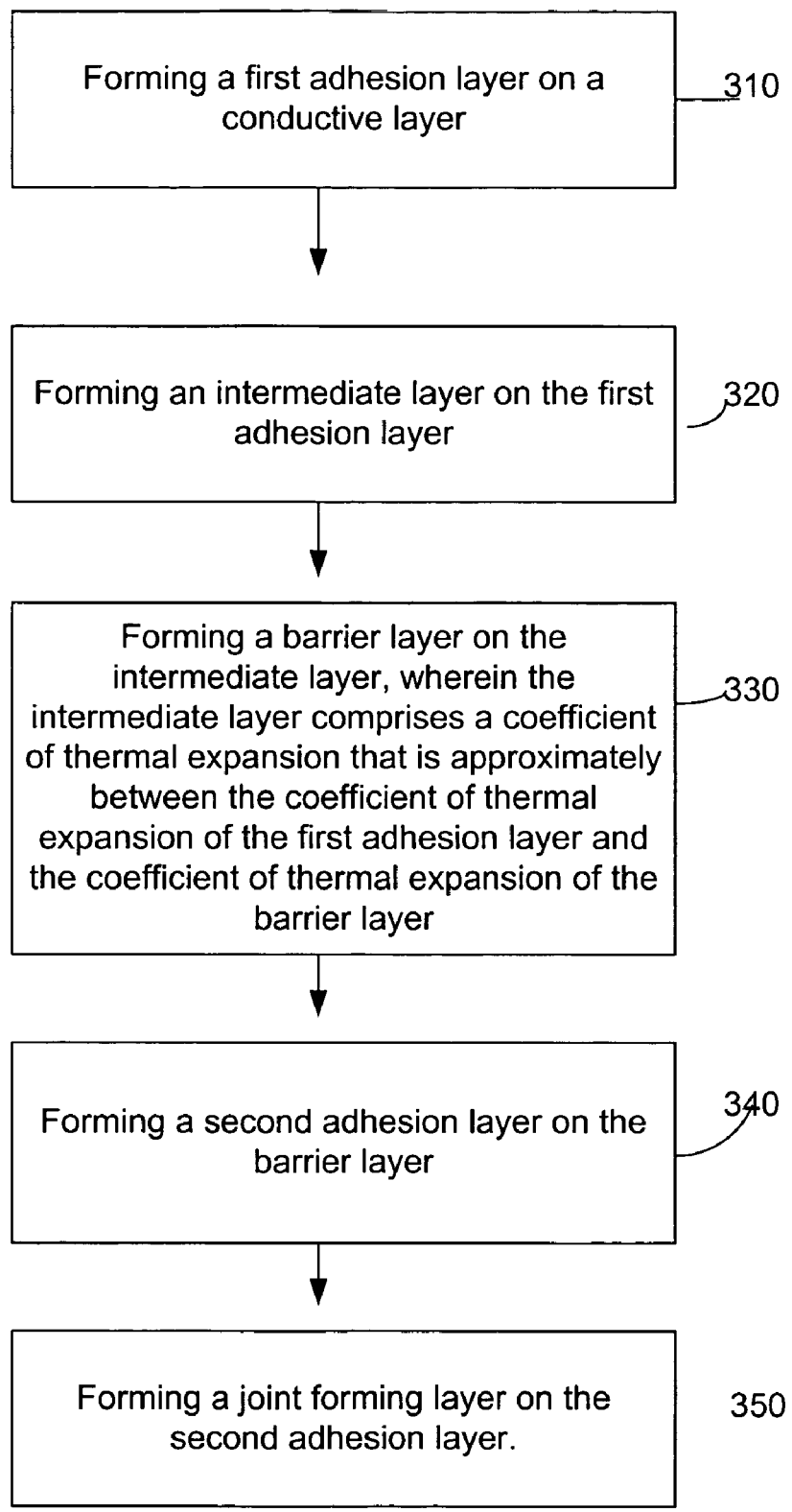
FIG. 3 represents a flow chart according to an embodiment of the present invention.

FIG. 3 depicts a flowchart according to an embodiment of the present invention. At step 310, a first adhesion layer may be formed on a conductive layer. At step 320, an intermediate layer may be formed on the first adhesion layer. At step 330, a barrier layer may be formed on the intermediate layer, wherein the intermediate layer comprises a coefficient of thermal expansion that is approximately between the coefficient of thermal expansion of the first adhesion layer and the coefficient of thermal expansion of the barrier layer. At step 340, a second adhesion layer may be formed on the barrier layer. At step 350, a joint forming layer may be formed on the second adhesion layer.

Figure 4A:
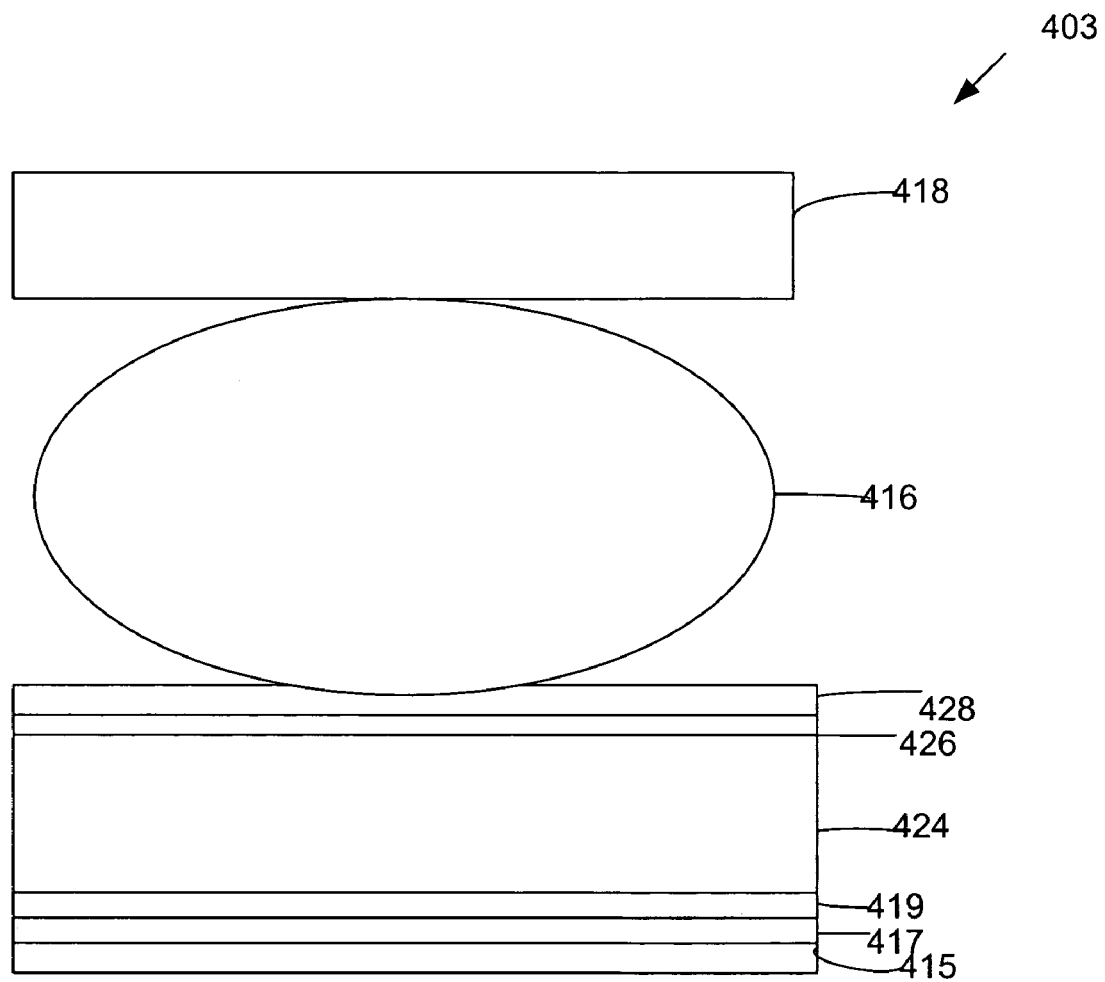
FIGS. 4a–4b represents a system according to an embodiment of the present invention.

FIG. 4a depicts a joint structure 403, similar to the joint structure 111 of FIG. 1h. A conductive layer 415 may be disposed on a first adhesion layer 417 that may be disposed on an intermediate layer 419 that may in turn be disposed on a barrier layer 424. A second adhesion layer 426 may be disposed on the barrier layer 424, and a joint forming layer 428 may be disposed on the second adhesion layer 426. An interconnect structure 416 may be disposed on the joint forming layer 428, and a substrate 418, such as for example a PC board, may be disposed on the interconnect structure 416. The presence of the intermediate layer 419 between the first adhesion layer 417 and the barrier layer 424 may prevent the diffusion of materials from the interconnect structure 416, such as but not limited to lead and tin, through cracks in the joint forming layer 428 that would likely occur in the absence of the intermediate layer 419.

Figure 4B:
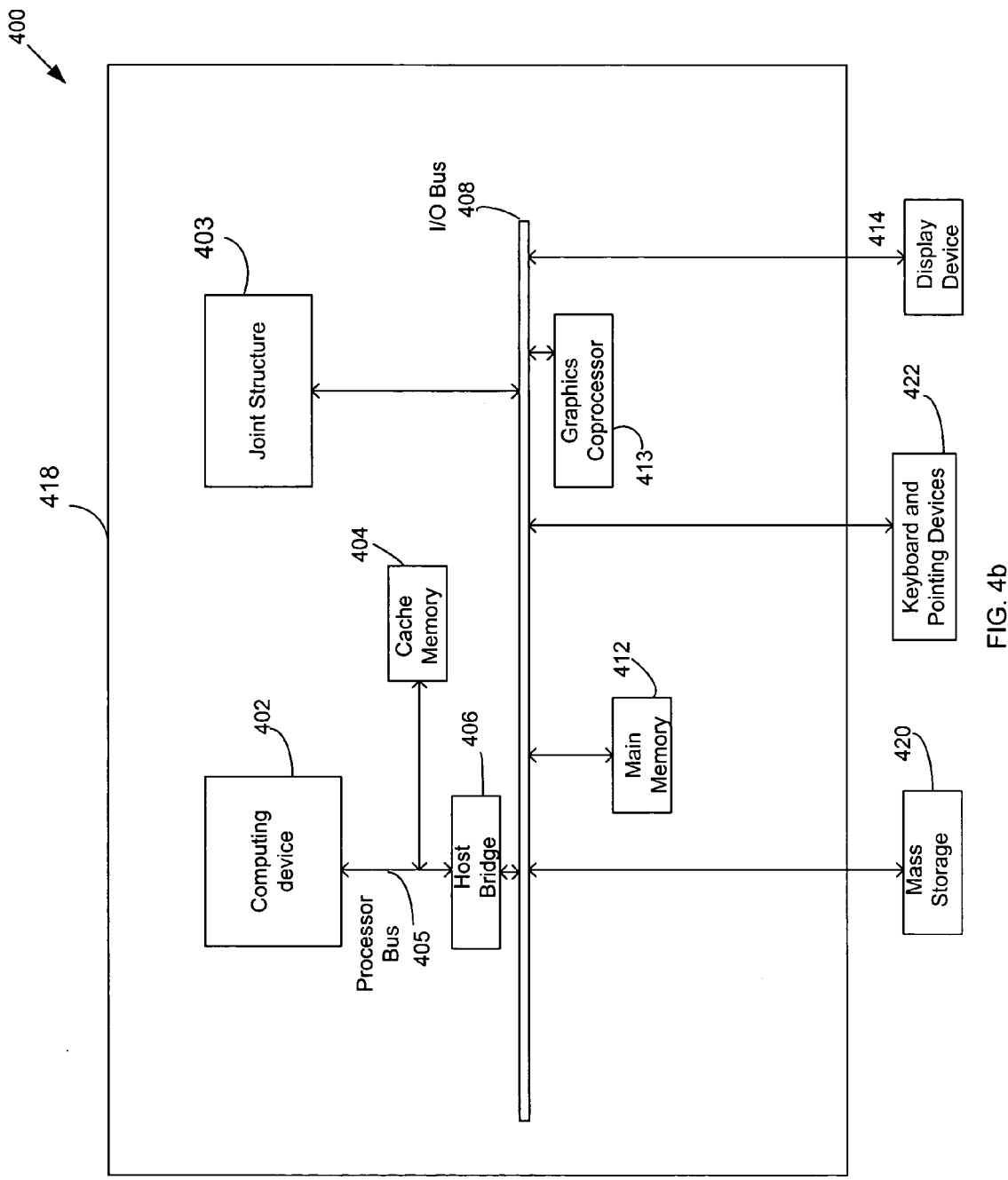

FIG. 4b is a diagram illustrating an exemplary system capable of being operated with methods for fabricating a microelectronic structure, such as the joint structure 403 of FIG. 4a for example. It will be understood that the present embodiment is but one of many possible systems in which the joint structures of the present invention may be used. The system 400 may be used, for example, to execute the processing by various processing tools, such as die attach tools, as are well known in the art, for the methods described herein.

In the system 400, the joint structure 403 may be communicatively coupled to a printed circuit board (PCB) 418 by way of an I/O bus 408. The communicative coupling of the joint structure 403 may be established by physical means, such as through the use of a package and/or a socket connection to mount the joint structure 403 to the PCB 418 (for example by the use of a chip package and/or a land grid array socket). The joint structure 403 may also be communicatively coupled to the PCB 418 through various wireless means (for example, without the use of a physical connection to the PCB), as are well known in the art.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the joint structure 403 may be a main memory 412. Examples of the main memory 412 may include, but are not limited to, static random access memory (SRAM) and/or dynamic random access memory (DRAM), and/or some other state preserving medium. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming joint structures in accordance with embodiments of the present invention, whereas main memory 412 may be used to store on a shorter term basis the executable instructions of a method for forming joint structures in accordance with embodiments of the present invention during execution by computing device 402. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 412 may supply the computing device 402 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as joint structures, are well known in the art. Therefore, the Figures provided herein illustrate only portions of an exemplary microelectronic device that pertains to the practice of the present invention. Thus the present invention is not limited to the structures described herein.

What is claimed is:

1. A method of forming a structure comprising;
   forming a first adhesion layer on a conductive layer;
   forming an intermediate layer on the first adhesion layer;
   forming a barrier layer on the intermediate layer, wherein the intermediate layer comprises a coefficient of thermal expansion that is approximately between the coefficient of thermal expansion of the first adhesion layer and the coefficient of thermal expansion of the barrier layer;
   forming a second adhesion layer on the barrier layer;
   forming a joint forming layer on the second adhesion layer; and
   forming an interconnect on the joint forming layer wherein the interconnect comprises at least one solder ball.

2. The method of claim 1 further comprising forming an intermetallic layer between the first adhesion layer and the barrier layer, wherein the intermetallic layer reduces diffusion of the barrier layer atoms through at least one of the second adhesion layer and the joint forming layer.

3. The method of claim 2 further comprising substantially reducing defects in at least one of the barrier layer, the second adhesion layer, and the joint forming layer.

4. The method of claim 3 wherein substantially reducing defects comprises substantially reducing at least one of cracks, grooves and hillocks.

5. The method of claim 2 wherein forming the intermetallic layer comprises forming the intermetallic layer from a material selected from the group consisting of nickel vanadium aluminum, silver, titanium palladium and combinations thereof.

6. The method of claim 1 wherein forming the first adhesion layer and forming the second adhesion layer comprises forming the first adhesion layer and forming the second adhesion layer from a material selected from the group consisting of titanium, titanium tungsten, and combinations thereof.

7. The method of claim 1 wherein forming the intermediate layer comprises forming an intermediate layer selected from the group consisting of nickel vanadium, silver, palladium, and combinations thereof.

8. The method of claim 7 wherein the coefficient of expansion of the intermediate layer comprises a range from about 8 ppm to about 23 ppm.

9. The method of claim 1 wherein forming the barrier layer comprises
forming a barrier layer comprising aluminum.

10. The method of claim 1 wherein forming the joint forming layer comprises forming the joint forming layer selected from the group consisting of nitride nickel vanadium, copper chrome alloys, copper nickel alloys and combinations thereof.

11. A method comprising:
forming a structure by:
forming a first adhesion layer on a conductive layer;
forming an intermediate layer on the first adhesion layer;
forming a barrier layer on the intermediate layer, wherein the intermediate layer comprises a coefficient of thermal expansion that is approximately between the coefficient of thermal expansion of the first adhesion layer and the coefficient of thermal expansion of the barrier layer;
forming a second adhesion layer on the barrier layer;
forming a joint forming layer on the second adhesion layer; and
forming an interconnect on the joint forming layer, wherein the interconnect comprises at least one solder ball.

12. The method of claim 11 further comprising wherein the at least one a solder ball comprises at least one of lead and tin.

13. The method of claim 12 further comprising attaching a substrate to the at least one solder ball, wherein the substrate is selected from the group consisting of a land grid array, an interposer, a motherboard and a test coupon.

14. The method of claim 11 further comprising substantially reducing defects in at least one of the barrier layer, the second adhesion layer, and the joint forming layer.

15. The method of claim 14 wherein substantially reducing defects comprises substantially reducing at least one of cracks, grooves and hillocks.

16. A structure comprising:
a first adhesion layer disposed on a conductive layer;
an intermediate layer disposed on the first adhesion layer;
a barrier layer disposed on the intermediate layer, wherein the intermediate layer comprises a coefficient of thermal expansion that is approximately between the coefficient of thermal expansion of the first adhesion layer and the coefficient of thermal expansion of the barrier layer;
a second adhesion layer disposed on the barrier layer;
a joint forming layer disposed on the second adhesion layer; and
an interconnect disposed on the joint forming layers wherein the interconnect comprises at least one solder ball.

17. The structure of claim 16 further comprising an intermetallic layer disposed between the first adhesion layer and the barrier layer.

18. The structure of claim 17 wherein the intermetallic layer is selected from the group consisting of nickel vanadium aluminum, silver, palladium, titanium and combinations thereof.

19. The structure of claim 16 wherein the first adhesion layer and the second adhesion layer are selected from the group consisting of titanium, titanium tungsten, copper, chrome and combinations thereof.

20. The structure of claim 16 wherein the barrier layer comprises aluminum.

21. The structure of claim 16 wherein the joint forming layer comprises a joint forming layer selected from the group consisting of nitride, nickel vanadium, copper chrome alloys, nickel chrome alloys, and combinations thereof.

22. The structure of claim 16 wherein the intermediate layer comprises an intermediate layer selected from the group consisting of nickel vanadium, silver, palladium and combinations thereof.

23. The structure of claim 16 further comprising wherein the interconnect is disposed on at least one of an interposer, a land grid array, a motherboard and a test coupon.

24. The structure of claim 16 wherein at least one of the barrier layer, the second adhesion layer, and the joint forming layer comprise less than about 40 defects per square micron.

25. A system comprising:
a joint structure comprising:
a first adhesion layer disposed on a conductive layer;
an intermediate layer disposed on the first adhesion layer;
a barrier layer disposed on the intermediate layer, wherein the intermediate layer comprises a coefficient of thermal expansion that is approximately between the coefficient of thermal expansion of the first adhesion layer and the coefficient of thermal expansion of the barrier layer;
a second adhesion layer disposed on the barrier layer;
a joint forming layer disposed on the second adhesion layer;
an interconnect disposed on the joint forming layer, wherein the interconnect comprises at least one solder ball;
a bus communicatively coupled to the joint structure; and
a DRAM communicatively coupled to the bus.

26. The system of claim 25 further comprising an intermetallic layer disposed between the first adhesion layer and the barrier layer.

27. The system of claim 25 wherein the intermetallic layer is selected from the group consisting of nickel vanadium aluminum, silver, palladium, titanium and combinations thereof.

28. The system of claim 25 wherein the intermediate layer comprises an intermediate layer selected from the group consisting of nickel vanadium, silver, palladium and combinations thereof.

29. A machine accessible media having associated instructions which, when accessed by a processor, result in:
forming a first adhesion layer on a conductive layer;
forming an intermediate layer on the first adhesion layer;
forming a barrier layer on the intermediate layer, wherein intermediate layer comprises a coefficient of thermal expansion that is approximately between the coefficient of thermal expansion of the first adhesion layer and the coefficient of thermal expansion of the barrier layer;
forming a second adhesion layer on the barrier layer;
forming a joint forming layer on the second adhesion layer; and
forming an interconnect on the joint forming layer, wherein the interconnect comprises at least one solder ball.

30. The media of claim 29 further comprising forming an intermetallic layer between the first adhesion layer and the barrier layer, wherein the intermetallic layer reduces diffusion of barrier layer atoms through at least one of the second adhesion layer and the joint forming layer.

31. The media of claim 29 further comprising substantially reducing defects in at least one of the barrier layer, the second adhesion layer, and the joint forming layer.

32. A method of forming a structure comprising:
forming a first adhesion layer on a conductive layer;
forming an intermediate layer on the first adhesion layer, wherein the intermediate layer is selected from the group consisting of nickel vanadium, silver, palladium, and combinations thereof;
forming a barrier layer on the intermediate layer, wherein the intermediate layer comprises a coefficient of thermal expansion that is approximately between the coefficient of thermal expansion of the first adhesion layer and the coefficient of thermal expansion of the barrier layer;
forming a second adhesion layer on the barrier layer; and
forming a joint forming layer on the second adhesion layer.

33. A method of forming a structure comprising:
forming a first adhesion layer on a conductive layer;
forming an intermediate layer on the first adhesion layer;
forming a barrier layer on the intermediate layer, wherein the intermediate layer comprises a coefficient of thermal expansion comprising a range from about 8 ppm per degree C to about 23 ppm per degree C;
forming a second adhesion layer on the barrier layer; and
forming a joint forming layer on the second adhesion layer.

34. A structure comprising:
a first adhesion layer disposed on a conductive layer;
an intermediate layer disposed on the first adhesion layer, wherein the intermediate layer comprises an intermediate layer selected from the group consisting of nickel vanadium, silver, palladium and combinations thereof;
a barrier layer disposed on the intermediate layer, wherein the intermediate layer comprises a coefficient of thermal expansion that is approximately between the coefficient of thermal expansion of the first adhesion layer and the coefficient of thermal expansion of the barrier layer;
a second adhesion layer disposed on the barrier layer; and
a joint forming layer disposed on the second adhesion layer.

35. A structure comprising:
a first adhesion layer disposed on a conductive layer;
an intermediate layer disposed on the first adhesion layer;
a barrier layer disposed on the intermediate layer, wherein the intermediate layer comprises a coefficient of thermal expansion that is approximately between the coefficient of thermal expansion of the first adhesion layer and the coefficient of thermal expansion of the barrier layer;
a second adhesion layer disposed on the barrier layer; and
a joint forming layer disposed on the second adhesion layer;
wherein at least one of the barrier layer, the second adhesion layer, and the joint forming layer comprise less than about 40 defects per square micron.

36. A system comprising:
a joint structure comprising:
a first adhesion layer disposed on a conductive layer;
an intermediate layer disposed on the first adhesion layer, wherein the intermediate layer comprises an intermediate layer selected from the group consisting of nickel vanadium, silver, palladium and combinations thereof;
a barrier layer disposed on the intermediate layer, wherein the intermediate layer comprises a coefficient of thermal expansion that is approximately between the coefficient of thermal expansion of the first adhesion layer and the coefficient of thermal expansion of the barrier layer;
a second adhesion layer disposed on the barrier layer;
a joint forming layer disposed on the second adhesion layer;
a bus communicatively coupled to the joint structure; and
a DRAM communicatively coupled to the bus.

* * * * *

UNITED STATES PATENT AND TRADEMARK OFFICE
CERTIFICATE OF CORRECTION

PATENT NO. : 7,087,521 B2 Page 1 of 1
APPLICATION NO. : 10/993609
DATED : August 8, 2006
INVENTOR(S) : Renavikar et al.

It is certified that error appears in the above-identified patent and that said Letters Patent is hereby corrected as shown below:

In column 3, at line 42, delete "in" and insert --In--.
In column 7, at line 58, delete "12" and insert --11--.
In column 8, at line 13, delete "layers" and insert --layer--.

Signed and Sealed this

Thirtieth Day of October, 2007

JON W. DUDAS
*Director of the United States Patent and Trademark Office*